(12) United States Patent
Sakurabayashi et al.

(10) Patent No.: US 10,867,820 B2
(45) Date of Patent: Dec. 15, 2020

(54) SUBSTRATE TRANSFER DEVICE AND SUBSTRATE TRANSFER METHOD

(71) Applicant: Tokyo Electron Limited, Tokyo (JP)

(72) Inventors: Tsutomu Sakurabayashi, Nirasaki (JP); Norihiko Tsuji, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 279 days.

(21) Appl. No.: 15/939,774

(22) Filed: Mar. 29, 2018

(65) Prior Publication Data

US 2018/0286715 A1    Oct. 4, 2018

(30) Foreign Application Priority Data

Mar. 31, 2017  (JP) ................. 2017-070956

(51) Int. Cl.
*H01L 21/67* (2006.01)
*B01D 53/26* (2006.01)
(Continued)

(52) U.S. Cl.
CPC ........ *H01L 21/67196* (2013.01); *B01D 53/04* (2013.01); *B01D 53/06* (2013.01); *B01D 53/261* (2013.01); *B01D 53/44* (2013.01); *H01L 21/67017* (2013.01); *H01L 21/67167* (2013.01); *H01L 21/67766* (2013.01); *H01L 21/67778* (2013.01); *H01L 21/68707* (2013.01);
(Continued)

(58) Field of Classification Search
CPC ......... H01L 21/67196; H01L 21/67778; H01L 21/67766; H01L 21/67017; H01L 21/68707; H01L 21/67167; B01D 53/04; B01D 53/261; B01D 53/06; B01D 53/44; B01D 2256/18; B01D 2257/70; B01D 2258/0216; B01D 2253/108; B01D 2256/10; B01D 2257/80; B01D 2259/40088

See application file for complete search history.

(56) References Cited

U.S. PATENT DOCUMENTS 5,890,367 A * 4/1999 You ................... F24F 3/161
                                                        62/78

FOREIGN PATENT DOCUMENTS

JP    10-230117 A    9/1998
JP    2003-110013 A   4/2003
(Continued)

*Primary Examiner* — Anthony J Zimmer
(74) *Attorney, Agent, or Firm* — Pearne & Gordon LLP

(57) ABSTRACT

An atmospheric transfer device 20 includes a wafer transfer mechanism 101 holding and transferring a wafer W; a housing 100 accommodating the wafer transfer mechanism 101; a gas supply unit 110 supplying an inert gas into the housing 100; a gas circulation unit 140 returning a gas discharged from the housing 100 back into the housing 100; and a foreign substance removing unit 150 removing a foreign substance contained in the gas discharged from the housing 100. The foreign substance removing unit 150 includes a humidifying unit 160 configured to add moisture to the gas discharged from the housing 100; a filter 170 configured to adsorb and remove, by using the moisture, the foreign substance contained in the gas humidified by the humidifying unit 160; and a dehumidifying unit 180 configured to remove the moisture from the gas from which the foreign substance is removed by the filter 170.

1 Claim, 5 Drawing Sheets

(51) Int. Cl.
  *B01D 53/06* (2006.01)
  *B01D 53/44* (2006.01)
  *H01L 21/687* (2006.01)
  *H01L 21/677* (2006.01)
  *B01D 53/04* (2006.01)

(52) U.S. Cl.
  CPC .... *B01D 2253/108* (2013.01); *B01D 2256/10* (2013.01); *B01D 2256/18* (2013.01); *B01D 2257/70* (2013.01); *B01D 2257/80* (2013.01); *B01D 2258/0216* (2013.01); *B01D 2259/40088* (2013.01)

(56) References Cited

FOREIGN PATENT DOCUMENTS

| | | |
|---|---|---|
| JP | 2016-162818 A | 9/2016 |
| JP | 2017-015321 A | 1/2017 |
| JP | 2017-028110 A | 2/2017 |
| KR | 10-0505061 B1 | 8/2005 |

\* cited by examiner

SUBSTRATE TRANSFER DEVICE AND SUBSTRATE TRANSFER METHOD

CROSS-REFERENCE TO RELATED APPLICATION

This application claims the benefit of Japanese Patent Application No 2017-070956 filed on Mar. 31, 2017, the entire disclosures of which are incorporated herein by reference.

TECHNICAL FIELD

The embodiments described herein pertain generally to a transfer device and a transfer method for transferring a substrate with respect to a processing apparatus of the substrate.

BACKGROUND

Conventionally, in a manufacturing process of a semiconductor device, there are used various kinds of substrate processing systems, such as a coating and developing system configured to perform a series of photolithography processings including a resist coating processing, an exposure processing, a developing processing, and so forth on, e.g., a semiconductor wafer (hereinafter, referred to as "wafer"), an etching system configured to perform an etching processing on the wafer, and a film forming system configured to form a coating film on the wafer.

In general, such a substrate processing system is equipped with a cassette station into/from which a cassette (FOUP: Front Opening Unified Pod) accommodating a multiple number of wafers is carried; a processing station equipped with various kinds of processing apparatuses configured to perform preset processings on the wafer; and so forth. Further, the cassette station is equipped with a wafer transfer device configured to take the wafer from the cassette, carry the wafer into the processing station and return the wafer back into the cassette upon the completion of the preset processings.

For example, in the wafer transfer device, a wafer is held and transferred by a wafer transfer mechanism within a housing. At this time, a gas containing an organic material (hereinafter, referred to as "organic gas") may be generated from the inside of the housing or from the wafer after being processed. This organic material may react with, for example, moisture in a gas within the housing, resulting in corrosion of various mechanisms such as the wafer transfer mechanism within the housing. Furthermore, since this organic material also has an adverse influence on an environment outside the housing, it is not desirable that the gas containing this organic material is exhausted to the outside of the housing without being processed properly. Conventionally, the gas containing this organic material is discharged to the outside after the organic material in the gas within the housing is removed by using a chemical filter as described in Patent Document 1, for example, while protecting the various mechanisms within the housing by performing corrosion resistant coating within the housing.

Meanwhile, it is described in Patent Document 2 that the inside of the wafer transfer device is set to be in a nitrogen gas atmosphere. To be specific, a highly clean nitrogen gas without containing moisture is supplied from a fan filter unit (FFU) provided at an upper portion of the housing of the wafer transfer device. In this case, although the organic gas is still generated from the inside of the housing or from the wafer after being processed, the organic material does not react with the moisture as the inside of the device is filled with the nitrogen gas. Therefore, the adverse influence such as corrosion of the various mechanisms can be suppressed.

Patent Document 1: Japanese Patent Laid-open Publication No. H10-230117

Patent Document 2: Japanese Patent Laid-open Publication No. 2017-028110

SUMMARY

In case of coating the inside of the housing of the wafer transfer device as stated above, however, since the corrosion resistant coating is of a high price, a high device cost and a high maintenance cost are caused.

Further, even in case of maintaining the inside of the housing of the wafer transfer device in the nitrogen gas atmosphere as described in the aforementioned Patent Document 2, since the organic gas is generated from the inside of the housing and, also, from the wafers after being processed, which are transferred consecutively, a concentration of the organic gas in the nitrogen gas atmosphere is increased. If the inside of the housing is replaced by clean air or opened to the atmosphere during the maintenance of the wafer transfer device, for example, the organic material would react with the moisture, resulting in the adverse effect on the inside of the housing.

Moreover, in case of setting the inside of the housing to be in the nitrogen gas atmosphere as disclosed in the aforementioned Patent Document 2, even when attempting to remove the organic material contained in the organic gas with the chemical filter, the organic material cannot be appropriately adsorbed and removed as the nitrogen gas does not contain the moisture.

In this regard, there is still a room for improvement in maintaining cleanness within the wafer transfer device by removing the organic material therein.

In view of the foregoing, exemplary embodiments provide a technique of maintaining cleanness of an atmosphere within a housing of a transfer device configured to transfer a substrate with respect to various processing apparatuses.

In one exemplary embodiment, there is provided a substrate transfer device configured to transfer a substrate with respect to a processing apparatus of the substrate. The substrate transfer device includes a transfer mechanism configured to hold and transfer the substrate; a housing accommodating the transfer mechanism; a gas supply unit configured to supply an inert gas into the housing; a gas circulation unit configured to return a gas discharged from the housing back into the housing; and a foreign substance removing unit configured to remove a foreign substance contained in the gas discharged from the housing. The foreign substance removing unit includes a humidifying unit configured to add moisture to the gas discharged from the housing; a filter configured to adsorb and remove, by using the moisture added to the gas, the foreign substance contained in the gas humidified by the humidifying unit; and a dehumidifying unit configured to remove the moisture from the gas from which the foreign substance is removed by the filter.

According to the exemplary embodiment, since the inside of the housing is set to be in the inert gas atmosphere, the foreign substance does not react with the moisture, so that an adverse influence upon the inside of the housing is suppressed, and a conventionally used high-priced coating is not required. Further, since the gas within the housing is reused by being circulated, a consumption amount of the inert gas can be reduced.

Further, even in case of using the inert gas without containing moisture as stated above, by adding the moisture to the gas discharged from the housing by the humidifying unit, it is still possible to adsorb and remove the foreign substance with the filter by using the moisture added to the gas. Further, since the moisture is removed by the dehumidifying unit from the gas from which the foreign substance is removed, the gas, which is dried and from which the foreign substance is removed, is returned into the housing, so that a reaction between a newly generated foreign substance and the moisture can be suppressed. Therefore, the inside of the housing can be maintained clean.

The gas supply unit may supply the inert gas from a top surface of the housing, and the foreign substance removing unit may be provided at a top surface side of the housing.

The gas circulation unit may be provided with a circulation pipeline which is connected to the housing and through which the gas within the housing is circulated. The foreign substance removing unit may be provided at the circulation pipeline.

The gas circulation unit may be provided with a circulation pipeline which is connected to the housing and through which the gas within the housing is circulated; and a bypass pipeline branched from and connected to the circulation pipeline. The foreign substance removing unit may be provided at the bypass pipeline.

The foreign substance removing unit may further include a water storage which is provided between the humidifying unit and the dehumidifying unit and configured to store water therein. The humidifying unit may use the water stored in the water storage, and the dehumidifying unit may store the water collected by the dehumidifying unit back in the water storage.

In another exemplary embodiment, there is provided a substrate transfer method of holding and transferring a substrate with respect to a processing apparatus of the substrate by a transfer mechanism accommodated in a housing. The substrate transfer method includes supplying an inert gas into the housing; returning a gas discharged from the housing back into the housing; and removing a foreign substance contained in the gas discharged from the housing. The removing of the foreign substance includes adding moisture to the gas discharged from the housing; allowing the gas humidified in the adding of the moisture to pass through a filter and adsorbing and removing the foreign substance by using the moisture in the gas; and removing the moisture from the gas from which the foreign substance is removed in the adsorbing and removing of the foreign substance.

According to the exemplary embodiments, it is possible to maintain cleanness of the atmosphere within the housing of the transfer device configured to transfer the substrate with respect to the various processing apparatuses.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
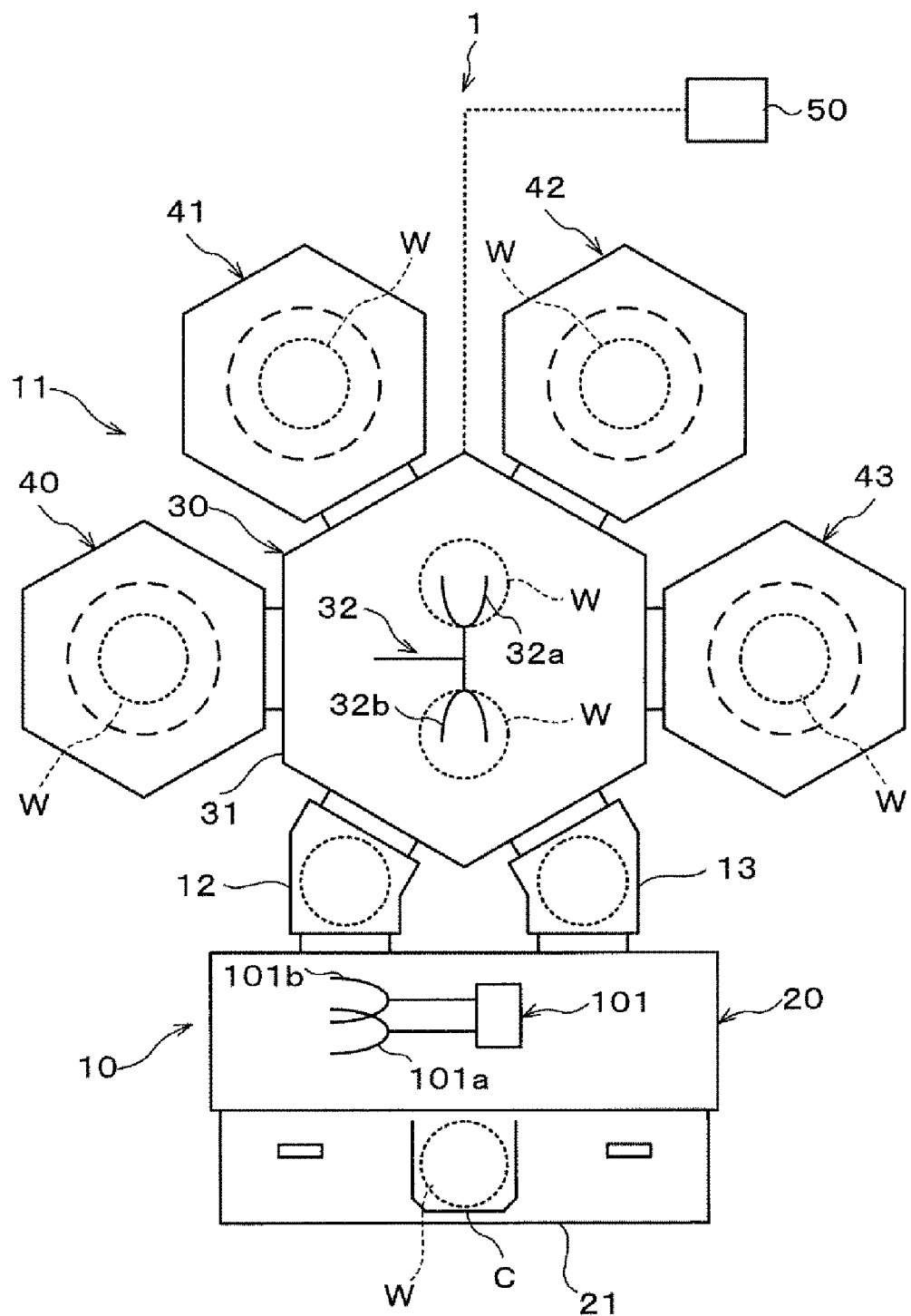
FIG. 1 is a plan view illustrating a schematic configuration of a substrate processing system equipped with an atmospheric transfer device according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the specification and drawings, parts having substantially the same function and configuration will be assigned same reference numerals, and redundant description will be omitted.

<Configuration of Substrate Processing System>

A configuration of a substrate processing system equipped with an atmospheric transfer device as a substrate transfer device according to an exemplary embodiment will be explained. FIG. 1 is a plan view illustrating a schematic configuration of a substrate processing system 1. In the substrate processing system 1, preset processings such as a film forming processing, a diffusing processing and an etching processing are performed on a semiconductor wafer W (hereinafter, referred to as "wafer W") as a substrate.

The substrate processing system 1 is equipped with a cassette station 10 into/from which a cassette C accommodating a multiple number of wafers W is carried; and a processing station 11 equipped with various kinds of processing apparatuses configured to perform the preset processings on the wafer W. The cassette station 10 and the processing station 11 are connected as one body with two load lock devices 12 and 13 therebetween. The load lock devices 12 and 13 are configured to connect an atmospheric transfer device 20 and a vacuum transfer device 30 to be described later. Each of the load lock devices 12 and 13 is configured such that an inside atmosphere thereof is switchable between an atmospheric state and a vacuum state.

The cassette station 10 is equipped with the atmospheric transfer device 20 and a cassette mounting table 21. Further, the cassette station 10 may be additionally provided with an orienter (not shown) configured to adjust a direction of the wafer W.

The atmospheric transfer device 20 transfers the wafer W with a wafer transfer mechanism 101 in the atmospheric pressure state. A configuration of this atmospheric transfer device 20 will be elaborated later.

The cassette mounting table 21 is provided at a side of the atmospheric transfer device 20 opposite to where the load lock devices 12 and 13 are provided. In the shown example, a plurality of, e.g., three cassettes C can be mounted on the cassette mounting table 21.

The processing station 11 is equipped with the vacuum transfer device 30 and processing apparatuses 40 to 43.

By way of example, the vacuum transfer device 30 has a hermetically sealed housing 31 having a polygonal shape (in the shown example, a hexagonal shape), when viewed from the top. The vacuum transfer device 30 is configured to maintain the inside of the housing 31 in a preset decompressed atmosphere (vacuum state). Further, a wafer transfer mechanism 32 configured to transfer the wafer W is provided within the housing 31. The wafer transfer mechanism 32 is equipped with two transfer arms 32*a* and 32*b* configured to hold the wafer W in a substantially horizontal manner, and transfers the wafer W while holding the wafer W with either one of the transfer arms 32*a* and 32*b*.

At an outside of the housing 31, the processing apparatuses 40 to 43 and the load lock devices 12 and 13 are arranged to surround the housing 31. For example, when viewed from the top, the load lock device 12, the processing apparatuses 40 to 43 and the load lock device 13 are arranged in this sequence in a clockwise direction, facing respective sides of the housing 31.

The processing apparatuses 40 to 43 perform preset processings such as a film forming processing, a diffusing processing and an etching processing on the wafer W. Further, each of the processing apparatuses 40 to 43 is configured to be capable of maintaining the inside thereof in a preset decompressed atmosphere (vacuum state). Various kinds of processing apparatuses suitable for the purpose of the wafer processing may be selected as the processing apparatuses 40 to 43.

The above-described substrate processing system 1 is equipped with a control unit 50. The control unit 50 is implemented by, for example, a computer and includes a program storage unit (not shown). The program storage unit stores a program for controlling the wafer processing in the substrate processing system 1. This program may be stored in a computer-readable recording medium such as a hard disk HD, a flexible disk FD, a compact disk CD, a magnet optical disk MO, a memory card, or the like and may be installed to the control unit 50 from the recording medium.

<Wafer Processing in Substrate Processing System>

Now, the wafer processing performed in the substrate processing system 1 having the above-described configuration will be discussed.

First, the cassette C accommodating the wafers W is carried into the cassette station 10 of the substrate processing system 1 and mounted on the cassette mounting table 21. Then, a single sheet of wafer W is taken out of the cassette C and carried into the load lock device 12 by the wafer transfer mechanism 101. If the wafer W is carried into the load lock device 12, the inside of the load lock device 12 is hermetically sealed and decompressed. Thereafter, the inside of the load lock device 12 and the inside of the housing 31 maintained in the decompressed state (vacuum state) with respect to the atmospheric pressure are allowed to communicate with each other. Then, the wafer W is carried out of the load lock device 12 and transferred into the housing 31 by the wafer transfer mechanism 32.

The wafer W carried into the housing 31 is then delivered into one of the processing apparatuses 40 to 43, and a preset processing is performed on the wafer W.

Afterwards, the wafer W is returned back into the housing 31 by the wafer transfer mechanism 32. Then, the wafer W is delivered to the wafer transfer mechanism 101 via the load lock device 13 and accommodated in the cassette C. Thereafter, the cassette C accommodating the corresponding wafer W is carried out of the substrate processing system 1, and a series of wafer processings is ended.

<Configuration of Atmospheric Transfer Device>

Figure 2:
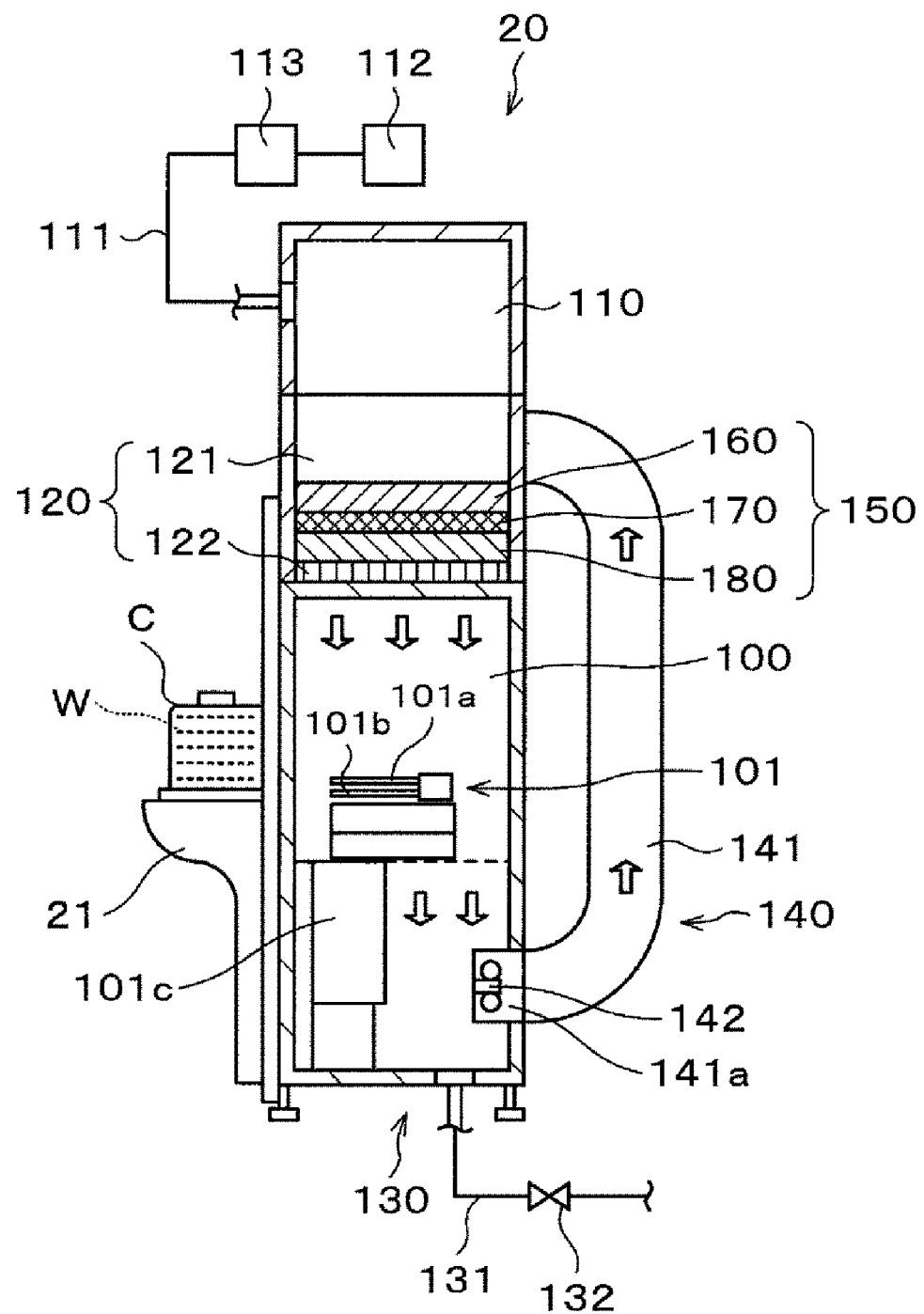
FIG. 2 is a longitudinal cross sectional view illustrating a schematic configuration of the atmospheric transfer device according to the exemplary embodiment.

Now, a configuration of the aforementioned atmospheric transfer device 20 will be explained. FIG. 2 is a longitudinal cross sectional view illustrating a schematic configuration of the atmospheric transfer device 20.

The atmospheric transfer device 20 is provided with a housing 100 having a structure in which an inside thereof can be hermetically sealed. The wafer transfer mechanism 101 configured to transfer the wafer W is provided within the housing 100. The wafer transfer mechanism 101 is equipped with two transfer arms 101*a* and 101*b* configured to hold the wafer W in a substantially horizontal posture. Each of the transfer arms 101*a* and 101*b* is configured to be pivotable and extensible/contractible in the horizontal direction. Further, the wafer transfer mechanism 101 is provided with an elevating unit 101*c* disposed under the transfer arms 101*a* and 101*b*. The transfer arms 101*a* and 101*b* are vertically movable up and down by the elevating unit 101*c*. The wafer transfer mechanism 101 is configured to transfer the wafer W while holding the wafer W with either one of the transfer arms 101*a* and 101*b*.

The housing 100 is provided with a gas supply unit 110 configured to supply an inert gas such as a nitrogen gas therein; a FFU (Fan Filter Unit) 120 configured to supply a downflow of the gas within the housing 100; a gas exhaust unit 130 configured to exhaust the gas within the housing 100; a gas circulation unit 140 configured to circulate the gas discharged from the housing 100; and a foreign substance removing unit 150 configured to remove a foreign substance contained in the gas discharged from the housing 100. Further, in the present exemplary embodiment, though the nitrogen gas is used as the inert gas, another inert gas such as an argon gas may be used instead.

The gas supply unit 110 is connected with a supply line 111 through which the nitrogen gas is supplied into the gas supply unit 110. The supply line 111 communicates with a nitrogen gas supply source 112 which stores therein the nitrogen gas. Further, the supply line 111 is provided with a supply mechanism group 113 including a valve for controlling a flow of the nitrogen gas, a flow rate controller, and so forth.

The FFU 120 includes a fan unit 121 and a filter unit 122. The fan unit 121 and the filter unit 122 are arranged in this sequence from the top. The fan unit 121 is equipped with a fan (not shown) configured to blow the gas downwards. The filter unit 122 has, by way of non-limiting example, a ULPA (Ultra Low Penetration Air) filter, and is configured to capture dust in the gas which has passed through the fan unit 121. The FFU 120 supplies the nitrogen gas supplied from the gas supply unit 110 into the housing 100 and creates the downflow of the gas within the housing 100.

The gas exhaust unit 130 has a gas exhaust line 131 connected to a lower portion of the housing 100. The gas exhaust line 131 is provided with a variable flow rate valve 132 configured to exhaust the gas to the outside of the housing 100 while adjusting a flow rate of the gas.

The gas circulation unit 140 has a circulation pipeline 141 configured to connect a lower portion of the housing 100 and the FFU 120. A fan 142 is provided at a gas outlet 141a of the circulation pipeline 141. The fan 142 circulates the gas within the housing 100 into the fan unit 121 of the FFU 120 through the circulation pipeline 141. In this way, by providing the gas circulation mechanism, the consumption amount of the nitrogen gas used in the housing 100 can be reduced.

In order to remove an organic material as a foreign substance contained in the gas discharged from the housing 100, the foreign substance removing unit 150 includes a humidifying unit 160, a chemical filter 170 and a dehumidifying unit 180. The humidifying unit 160, the chemical filter 170 and the dehumidifying unit 180 are provided within the fan unit 121 of the FFU 120 in this sequence from an upstream side towards a downstream side along the flow of the gas.

Figure 3:
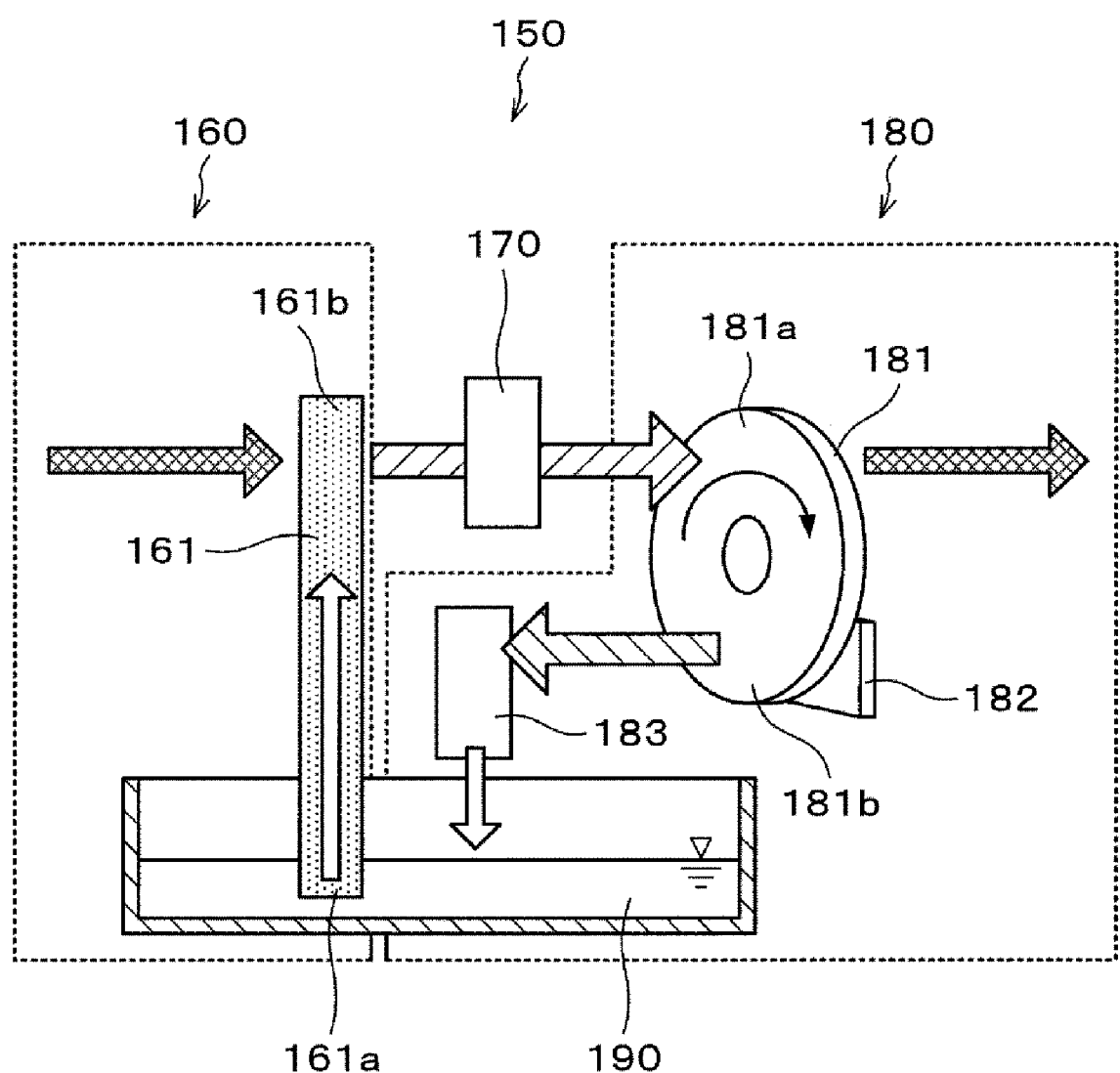
FIG. 3 is an explanatory diagram illustrating a schematic configuration of a foreign substance removing unit according to the exemplary embodiment.

FIG. 3 is an explanatory diagram schematically illustrating a configuration of the foreign substance removing unit 150. As depicted in FIG. 3, a water storage 190 storing therein water in a liquid state is provided between the humidifying unit 160 and the dehumidifying unit 180. Further, in the drawing, hatched thick arrows indicate a flow of a dried gas; dashed thick arrows, a flow of a wet gas; and white thick arrows, a flow of the water in the liquid state.

The humidifying unit 160 may be of various types. The present exemplary embodiment is described for an example case where a vaporization type humidifying unit is used. In this case, the humidifying unit 160 is equipped with a vaporization filter 161. One end 161a of the vaporization filter 161 is soaked in the water of the water storage 190. The water is pulled up from the one end 161a toward the other end 161b of the vaporization filter 161 by capillary phenomenon, and by allowing the dried gas to pass through a side of the other end 161b of the vaporization filter 161, the water evaporates. Accordingly, moisture is added to the gas which has passed through the vaporization filter 161 after being discharged from the housing 100.

The chemical filter 170 adsorbs and removes the organic material contained in the humidified gas in the humidifying unit 160 by using the moisture in the corresponding gas. Further, though the foreign substance is the organic material in the present exemplary embodiment, the foreign substance is not merely limited thereto. Regardless of the kind of the foreign substance, however, the corresponding foreign substance can be removed by appropriately changing the kind of the chemical filter 170.

Various types of dehumidifying unit 180 may be used. Here, in the present exemplary embodiment, desiccant dehumidifying unit is used, for example. In this case, the dehumidifying unit 180 includes a desiccant 181, a heating mechanism 182 and a heat exchanger 183. The desiccant 181 has a substantially circular plate shape and is configured to be pivotable and to allow the gas to pass through an upper portion 181a of the desiccant 181. By way of non-limiting example, zeolite is used as the desiccant 181. The heating mechanism 182 is provided adjacent to a lower portion 181b of the desiccant 181. The heating mechanism 182 may be implemented by, but not limited to, a heater.

In the dehumidifying unit 180, the gas from which the organic material is removed by the chemical filter 170 is made to pass through the upper portion 181a of the desiccant 181 being rotated, so that the moisture is removed from the gas. This moisture-free gas is then returned back into the housing 100 through the circulation pipeline 141. Meanwhile, the desiccant 181 containing the moisture is moved to the lower portion 181b and heated by the heating mechanism 182. Accordingly, the water contained in the desiccant 181 is removed as a vapor by being evaporated. This vapor is turned back into the water in the liquid state by being cooled in the heat exchanger 183 and stored in the water storage 190.

The water storage 190 is, for example, a tank configured to store water therein. As stated above, the water removed by the dehumidifying unit 180 is stored in the water storage 190, and this water is reused in the humidifying unit 160. Thus, the water can be used effectively, so that the consumption amount of the water used can be reduced.

<Gas Control in Atmospheric Transfer Device>

Now, a gas control in the atmospheric transfer device 20 having the above-described configuration will be discussed.

First, when the apparatus starts to be driven, that is, before a typical operation is performed, the atmosphere within the housing 100 is replaced by the nitrogen gas. To elaborate, the nitrogen gas is supplied into the housing 100 from the gas supply unit 110 via the FFU 120, and the gas within the housing 100 is exhausted out by the gas exhaust unit 130. Accordingly, the atmosphere within the housing 100 is replaced by the nitrogen gas. At this time, the gas circulation through the gas circulation unit 140 is not performed.

Though the organic gas containing the organic material is generated from the inside of the housing 100 or from the wafer after being processed in the typical operation, since the inside of the housing 100 is maintained in the nitrogen gas atmosphere, the organic material does not react with moisture, so that the adverse influence upon the inside of the housing 100 is suppressed. Meanwhile, if the inside of the housing 100 is replaced by clean air or opened to the atmosphere during maintenance, for example, this organic material reacts with moisture. Thus, by circulating the gas within the housing 100 through the gas circulation unit 140 and removing the organic material by the foreign substance removing unit 150, the gas is cleaned. At this time, in principle, the supply of the nitrogen gas from the gas supply unit 110 is stopped, and the gas exhaust by the gas exhaust unit 130 is also stopped. Accordingly, the consumption amount of the nitrogen gas can be reduced, so that the running cost can be cut.

In the gas circulation unit 140, the gas within the housing 100 is flown into the circulation pipeline 141 by the fan 142. This gas is then flown to the FFU 120. Then, in the foreign substance removing unit 150, moisture is added to this gas by the humidifying unit 160, and this humidified gas is made to pass through the chemical filter 170 where the organic material is adsorbed and removed from the gas by using the moisture contained in this gas. Then, the moisture is removed from this gas, from which the organic material has been removed, by the dehumidifying unit 180. The gas, which is dried and from which the organic material is removed, is then returned back into the housing 100. As stated, since the gas returned back to the housing 100 is free of moisture, the reaction between the organic material and the moisture can be suppressed. Accordingly, the inside of the housing 100 can be maintained clean.

According to the present exemplary embodiment as described above, by circulating the nitrogen gas, the inside of the housing 100 can be maintained in appropriate cleanness while reducing the consumption amount of the nitrogen gas used.

<Another Exemplary Embodiment of Atmospheric Transfer Device 20>

Now, another exemplary embodiment of the atmospheric transfer device 20 will be explained.

In the atmospheric transfer device 20 according to the above-described exemplary embodiment, the humidifying unit 160, the chemical filter 170 and the dehumidifying unit 180 of the foreign substance removing unit 150 are provided within the FFU 120. However, the arrangement of these components is not limited thereto.

Figure 4:
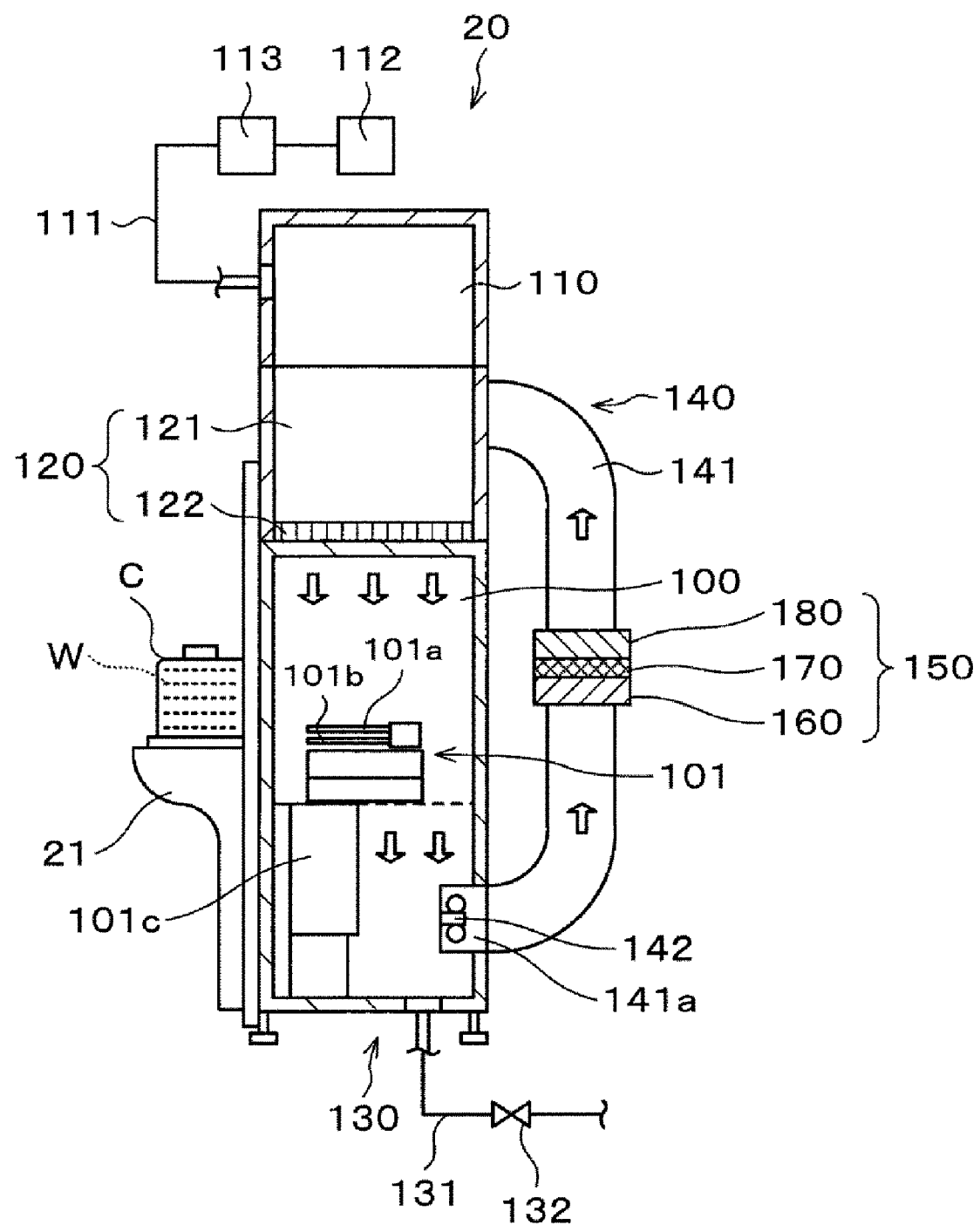
FIG. 4 is a longitudinal cross sectional view illustrating a schematic configuration of an atmospheric transfer device according to another exemplary embodiment.

By way of example, as shown in FIG. 4, the humidifying unit 160, the chemical filter 170 and the dehumidifying unit 180 may be provided in the circulation pipeline 141. In this case as well, the same effect as obtained in the above exemplary embodiment can be achieved. Here, it is desirable that the foreign substance removing unit 150 is placed at a position close to the inside of the housing 100, that is, at upstream side of the circulation pipeline 141. By disposing the foreign substance removing unit 150 at the upstream side of the circulation pipeline 141, an area of the circulation pipeline 141 exposed to an atmosphere with a high concentration of organic material can be reduced. As a result, an area of the circulation pipeline 141 which is corroded can be reduced, so that the particle generation can be suppressed.

Figure 5:
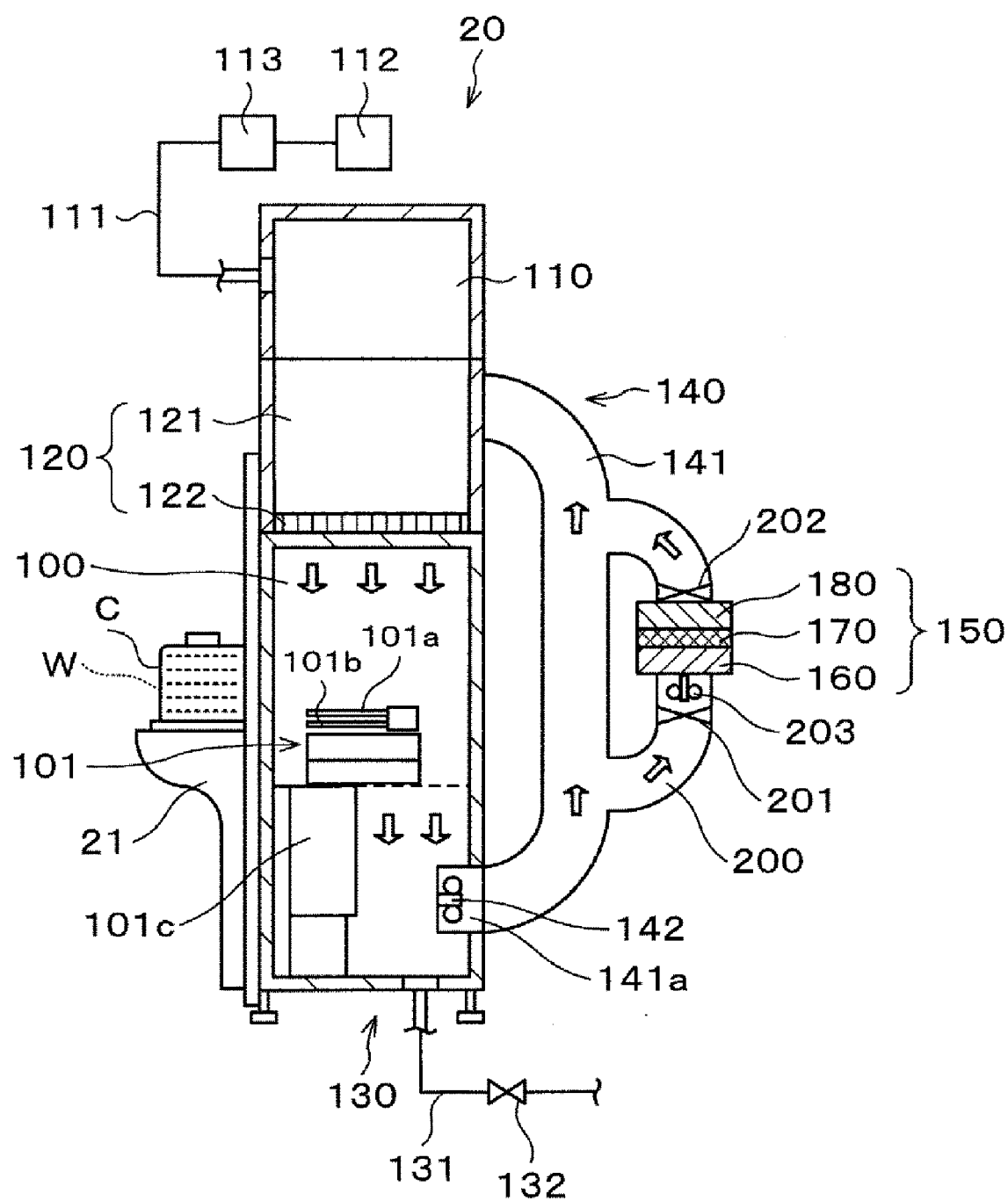
FIG. 5 is a longitudinal cross sectional view illustrating a schematic configuration of an atmospheric transfer device according to still another exemplary embodiment.

Furthermore, as illustrated in FIG. 5, for example, a bypass pipeline 200 branched from and connected to the circulation pipeline 141 is provided, and the humidifying unit 160, the chemical filter 170 and the dehumidifying unit 180 may be provided in this bypass pipeline 200. In this configuration, within the bypass pipeline 200, a valve 201 is provided at an upstream side of the humidifying unit 160, and a valve 202 is provided at a downstream side of the dehumidifying unit 180. Further, within the bypass pipeline 200, a fan 203 is provided at an upstream side of the humidifying unit 160.

In case that a flow rate (hereinafter, referred to as a "circulation rate") of the gas circulated in the gas circulation unit 140 is larger than a flow rate (hereinafter, referred to as "processing rate") of the gas capable of being processed by the chemical filter 170, the gas may not be appropriately circulated if the chemical filter 170 is disposed within the FFU 120 as illustrated in FIG. 2. Likewise, the chemical filter 170 may not be disposed in the gas circulation unit 140 as shown in FIG. 4. Thus, in such a case, the bypass pipeline 200 is provided, and only the gas in an amount capable of being processed by the chemical filter 170 is allowed to flow into the bypass pipeline 200.

Further, since the humidifying unit 160, the chemical filter 170 and the dehumidifying unit 180 are provided in the bypass pipeline 200, a pressure loss of the bypass pipeline 200 is larger than that of the circulation pipeline 141. Accordingly, the fan 203 is used to allow the gas to be flown to the bypass pipeline 200 appropriately.

The valves 201 and 202 are provided to suppress the gas from flowing into the bypass pipeline 200 when replacing the chemical filter 170, for example. By using these valves 201 and 202, the chemical filter 170 can be replaced without needing to stop the typical operation. Thus, a downtime in the wafer processing can be reduced.

Further, in the gas circulation unit 140 according to the present exemplary embodiment, the gas within the housing 100 is flown into the circulation pipeline 141 by the fan 142, and the gas within the circulation pipeline 141 is flown into the bypass pipeline 200 by the fan 203. In the bypass pipeline 200, the humidification of the gas by the humidifying unit 160, the removal of the organic material by the chemical filter 170 and the dehumidification of the gas by the dehumidifying unit 180 are performed in sequence. Then, the gas, which is dried and from which the organic material is removed, is returned back into the housing 100 through the circulation pipeline 141. Accordingly, the inside of the housing 100 can be maintained clean.

Moreover, when the gas flows from the circulation pipeline 141 into the bypass pipeline 200, the gas in an amount corresponding to the processing rate subtracted from the circulation rate flows in the circulation pipeline 141. Although this amount of gas is returned into the housing 100 in a state that the organic material is still contained therein, this organic material is removed gradually as the gas is circulated repeatedly, and, ultimately, the inside of the housing 100 can be maintained clean.

According to this exemplary embodiment, the same effect as obtained in the above-described exemplary embodiments can be achieved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The above exemplary embodiments have been described for the case where the substrate processing system processes the wafer in the decompressed atmosphere (vacuum state). However, the substrate processing system may be a coating and developing system configured to perform a series of photolithography processings such as a resist coating processing, an exposure processing and a developing processing. The substrate transfer device (atmospheric transfer device) according to the exemplary embodiments can be applied to any of various types of transfer devices configured to transfer the substrate under the atmospheric atmosphere.

Furthermore, the substrate is not limited to the wafer. That is, the exemplary embodiments are also applicable to various types of substrates such as a FPD (flat panel display), a mask reticle for photomask, and so forth.

The exemplary embodiments can be used when transferring a substrate in an atmospheric pressure state. Particularly, the exemplary embodiments have advantages when they are applied to transfer the substrate in a substrate processing system for use in a manufacturing process of a semiconductor device.

We claim:

1. A substrate transfer method of holding and transferring a substrate with respect to a processing apparatus of the substrate by a transfer mechanism accommodated in a housing, the substrate transfer method comprising:
supplying an inert gas into the housing;
returning a gas discharged from the housing back into the housing; and
removing a foreign substance contained in the gas discharged from the housing,
wherein removing the foreign substance comprises:

storing water in a water storage which is provided between a humidifying unit and a dehumidifying unit, adding moisture, by the humidifying unit, to the gas discharged from the housing, using the water stored in the water storage;

allowing the gas humidified with the moisture to pass through a filter and adsorbing and removing the foreign substance by using the moisture in the gas;

removing the moisture, by the dehumidifying unit, from the gas from which the foreign substance is removed in the adsorbing and removing of the foreign substance; and storing, by the dehumidifying unit, the water collected by the dehumidifying unit back in the water storage.

* * * * *